United States Patent
Uemura

(10) Patent No.: US 7,023,020 B2
(45) Date of Patent: Apr. 4, 2006

(54) GROUP III NITRIDE COMPOUND SEMICONDUCTOR LIGHT-EMITTING DEVICE

(75) Inventor: Toshiya Uemura, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 929 days.

(21) Appl. No.: 09/900,980

(22) Filed: Jul. 10, 2001

(65) Prior Publication Data

US 2002/0030201 A1 Mar. 14, 2002

(30) Foreign Application Priority Data

Jul. 10, 2000 (JP) ..................... P.2000-208070

(51) Int. Cl.
*H01L 33/00* (2006.01)

(52) U.S. Cl. ............... 257/94; 257/79; 257/97
(58) Field of Classification Search .................. 257/94, 257/79, 97, 12, 13, 85, 96, 103, 627, 628, 257/190, 76, 200, 201, 100, 99, 67; 372/46, 372/45

See application file for complete search history.

(56) References Cited

U.S. PATENT DOCUMENTS

| 5,587,593 | A | * | 12/1996 | Koide et al. | 257/94 |
| 5,700,713 | A | * | 12/1997 | Yamazaki et al. | 438/25 |
| 5,814,533 | A | * | 9/1998 | Shakuda | 438/46 |
| 5,838,029 | A | * | 11/1998 | Shakuda | 257/190 |
| 5,974,069 | A | * | 10/1999 | Tanaka et al. | 372/46 |
| 6,087,681 | A | * | 7/2000 | Shakuda | 257/103 |
| 6,274,891 | B1 | * | 8/2001 | Tanaka et al. | 257/99 |
| 6,298,079 | B1 | * | 10/2001 | Tanaka et al. | 372/46 |
| 6,342,404 | B1 | * | 1/2002 | Shibata et al. | 438/46 |
| 6,541,798 | B1 | * | 4/2003 | Koike et al. | 257/94 |
| 6,617,061 | B1 | * | 9/2003 | Koike et al. | 428/698 |
| 6,674,098 | B1 | * | 1/2004 | Niki et al. | 257/102 |
| 6,735,230 | B1 | * | 5/2004 | Tanabe et al. | 372/43 |

FOREIGN PATENT DOCUMENTS

| JP | 50-105286 | 8/1975 |
| JP | 51-18788 | 6/1976 |
| JP | 03-129882 | 6/1991 |
| JP | 04-087380 | 3/1992 |
| JP | 08-186287 | 7/1996 |
| JP | 10-173229 | 6/1998 |
| JP | 2001-024222 | 1/2001 |

OTHER PUBLICATIONS

Japanese Office Action dated Jan. 18, 2005 with English translation.

* cited by examiner

*Primary Examiner*—Laura M Schillinger
(74) *Attorney, Agent, or Firm*—McGinn IP Law Group, PLLC

(57) ABSTRACT

A groove is formed in a semiconductor laminate portion containing a light-emitting layer so that the groove starts from a light emission observation surface of the semiconductor laminate portion to reach at least the light-emitting layer. In such a manner, light is released from an opening portion of the groove.

14 Claims, 4 Drawing Sheets

GROUP III NITRIDE COMPOUND SEMICONDUCTOR LIGHT-EMITTING DEVICE

BACKGROUND OF THE INVENTION

1. Field of the Invention

The present invention relates to a group III nitride compound semiconductor light-emitting device.

The present application is based on Japanese Patent Application No. 2000-208070, which is incorporated herein by reference.

2. Description of the Related Art

Group III nitride compound semiconductors are used in a light-emitting device such as a light-emitting diode or the like. Such a light-emitting device is configured so that group III nitride compound semiconductor layers having a device function are epitaxially grown on a surface of a substrate, for example, made of sapphire. For example, a light-emitting diode is configured so that an n-type clad layer, a light-emitting layer and a p-type clad layer are laminated successively on a substrate. Because the sapphire substrate has electrically insulating characteristic, both positive and negative electrodes need to be taken out from one surface side. To provide the negative electrode (n-type seat electrode), a contact layer is formed under the n-type clad layer and partially revealed by etching. Because the p-type group III nitride compound semiconductor layer generally has high resistance, it is impossible to disperse an electric current on the whole region of the p-type clad layer when the positive electrode (p-type seat electrode) is merely provided on the p-type clad layer.

In the background art, therefore, a light-transmissible electrode is attached onto the whole surface of the p-type clad layer. A p-type contact layer may be further provided between the light-transmissible electrode and the p-type clad layer.

Light emitted from the light-emitting layer passes through the p-type semiconductor layer and the light-transmissible electrode and goes out to the outside. That is, the light-transmissible electrode is disposed to face the direction of the optical axis, so that the light-transmissible electrode serves as a light emission observation surface.

A higher light emission output is required of the light-emitting device. Therefore, various improvements have been made. Paying attention to the fact that the quantity of light emitted in the lateral direction of the device is large, the inventor of the present invention has conceived a configuration in which light emitted from a side surface of a device is reflected efficiently toward the direction of the optical axis.

The configuration is that a groove is mechanically provided in the circumferential edge of the device so that light emitted in the lateral direction of the device from a light-emitting layer revealed in the groove is reflected toward the direction of the optical axis by use of a side surface of the groove.

SUMMARY OF THE INVENTION

The present invention also pays attention to the light emitted laterally from a device and an object of the present invention is to improve total light-emitting efficiency or light emission output of the device by use of the laterally emitted light.

The present invention is devised to achieve the foregoing object and configured as follows.

A group III nitride compound semiconductor light-emitting device comprising:

a semiconductor laminate portion containing a light-emitting layer; and a groove formed in said semiconductor laminate portion so as to extend from a light emission observation surface of the semiconductor laminate portion to reach at least the light-emitting layer.

According to the group III nitride compound semiconductor light-emitting device configured as described above, the light-emitting layer is revealed on a side surface of the groove. Hence, light emitted from the light-emitting layer into the groove is reflected by the circumferential surface of the groove and goes out in the direction of the optical axis from an opening portion of the groove formed in a light emission observation surface. The intensity per unit area of light emitted directly laterally (toward the inside of the groove in the case of the present invention) from the light-emitting layer is very high compared with the light emission observation surface. Hence, the quantity of light emitted from the opening portion of the groove is larger than that of light emitted from the light emission observation surface having an area equal to that of the opening portion. Hence, even in the case where the area of the light-emitting layer is reduced because of the groove, the total quantity of light emitted from the light emission observation surface increases due to the large quantity of light emitted from the groove. In this manner, a high output can be achieved.

Features and advantages of the invention will become understood from the following detailed description of the preferred embodiments described in conjunction with the attached drawings.

DETAILED DESCRIPTION OF THE PREFERRED EMBODIMENTS

Figure 1:
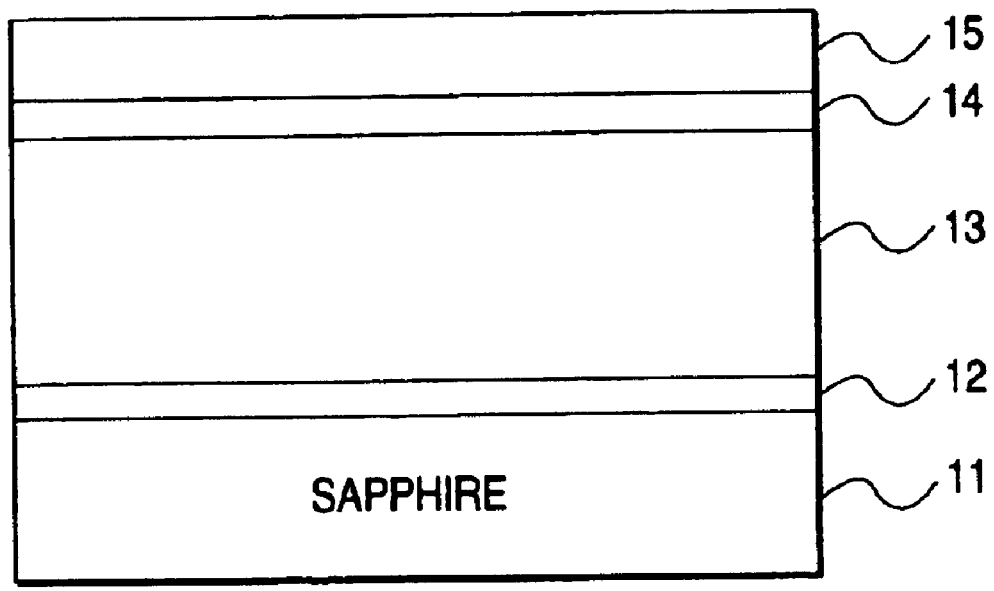
FIG. 1 is a sectional view showing the configuration of group III nitride compound semiconductor layers in a light-emitting device according to an embodiment of the present invention.
Figure 2:
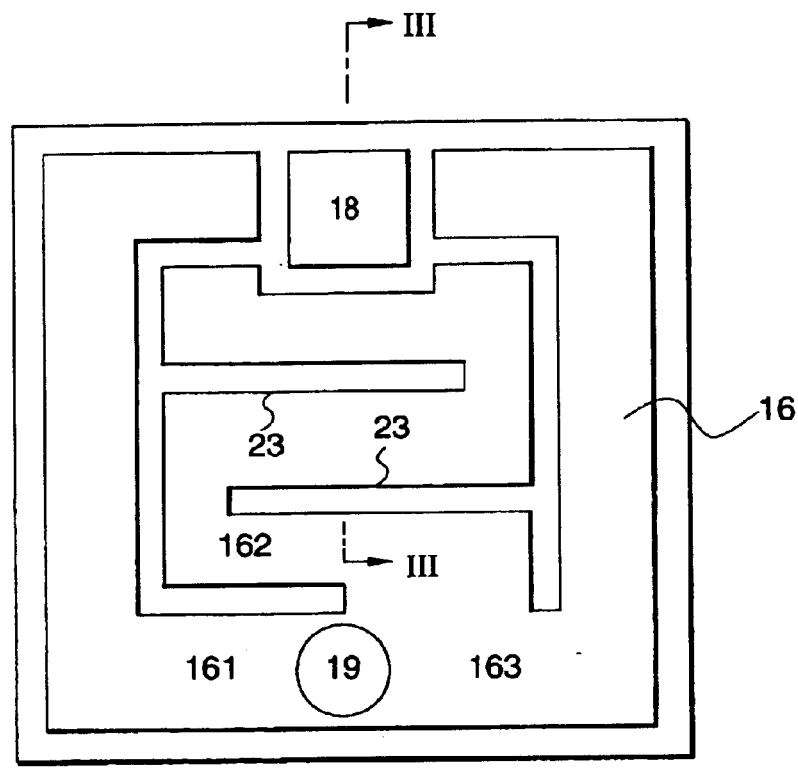
FIG. 2 is a plan view of the light-emitting device in this embodiment.

Constituent parts of the present invention will be described below in detail.

The semiconductor laminate portion is made of a laminate of a plurality of group III nitride compound semiconductor layers inclusive of a light-emitting layer. In this specification, each group III nitride compound semiconductor is represented by the general formula: $Al_XGa_YIn_{1-X-Y}N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_XGa_{1-X}N$, $Al_XIn_{1-X}N$ and $Ga_XIn_{1-X}N$ (here, $0<X<1$). The group III elements may be partially replaced by boron (B), thallium (Tl), or the like. The nitrogen (N) may be partially replaced by phosphorus (P), arsenic (As), antimony (Sb), bismuth (Bi), or the like.

The group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities. Incidentally, the group III nitride compound semiconductor doped with p-type impurities may be irradiated with electron beams or with plasma or heated in a furnace. The method of forming each group III nitride compound semiconductor layer is not particularly limited. For example, the group III nitride compound semiconductor layer may be formed by a metal organic chemical vapor deposition method (MOCVD method) or may be formed by a well known method such as a molecular beam epitaxy method (MBE method), a halide vapor phase epitaxy method (HVPE method), a sputtering method, an ion-plating method, an electron showering method, etc.

Incidentally, a structure provided with a homo, hetero or double hetero structure may be used as the structure of the light-emitting device (in these cases, the layer contributing to light emission is referred to as light-emitting layer). A quantum well structure (single quantum well structure or multiple quantum well structure) maybe used as the light-emitting layer.

A substrate for a light-emitting device is not limited to a specific one on which the group III nitride compound semiconductor layer may be grown. For example, sapphire, spinel ($MgAl_2O_4$), SiC (including 6H, 4H and 3C), zinc oxide (ZnO), zinc sulfide (ZnS), aluminum oxide, Group III nitride compound semiconductor single crystal (GaAs, GaP, etc.), silicon (Si) or the like may be used as a material for the substrate. Especially, it is preferable to use a sapphire substrate.

The groove is formed so as to extend from the light emission observation surface side of the semiconductor laminate portion to reach at least the light-emitting layer so that the light-emitting layer is revealed on the side surface of the groove. Hence, light generated in the revealed portion of the light-emitting layer is emitted into the groove and reflected by the circumferential wall of the groove so as to go out from the opening portion of the groove to the outside.

The width of the groove is not particularly limited but preferably selected to be in a range of from 0.5 to 30 µm. If the width of the groove is smaller than 0.5 µm, there is a risk that a large part of the light emitted from the side wall of the groove may be absorbed into the group III nitride compound semiconductor layers so that the quantity of light to be emitted from the opening portion on the light emission observation surface side to the outside becomes insufficient. If the width of the groove is larger than the upper limit 30 µm, the bad influence of the bottom portion of the groove having no contribution to light emission appears undesirably. Incidentally, the width of the groove is selected to be more preferably in a range of from 1 to 25 µm, further preferably in a range of from 1.5 to 20 µm, still further preferably in a range of from 2 to 15 µm, most preferably in a range of from 3 to 10 µm.

The width of the groove does not need to be uniform both in a planar direction of the light emission observation surface and in a direction of the depth. Hence, a groove V-shaped in section may be used.

It is however preferable that the groove is distributed substantially evenly in the light emission observation surface. That is, by prohibiting the groove from being unevenly distributed, it is possible to distribute the light, which leaks from the groove, evenly over the light emission observation surface to thereby prevent deviation in distribution of the light emission.

The method of forming such a groove is not particularly limited, but it is preferable to form the groove by using etching which is executed when the n-type seat electrode-forming surface is revealed, in view of using a production process in common. In this case, the n-type seat electrode-forming surface is formed at a level substantially equal to the bottom of the groove.

Alternatively, the groove may be formed by etching which is a process provided separately from the etching process of forming the n-type seat electrode-forming surface.

The aforementioned etching process for the groove is performed by dry etching using a gas such as argon, chlorine, or the like.

It is preferable that the light-transmissible metal electrode is formed on the whole region of the p-type semiconductor. This is because, in the group III nitride compound semiconductor, the p-type semiconductor layer is generally high in electric resistance so that a current is evenly injected into the light-emitting layer to make it possible to obtain sufficient light emission. Because the light-transmissible electrode is hence formed up to the edge portion of the p-type contact layer, the effective light-emitting portion reaches a side surface of the semiconductor laminate portion. As a result, intensive light is emitted from the side surface.

For example, an alloy containing cobalt and gold may be used as the light-transmissible electrode. In the alloy, the cobalt may be partially replaced by at least one element selected from the group consisting of nickel (Ni), iron (Fe), copper (Cu), chromium (Cr), tantalum (Ta), vanadium (V), manganese (Mn), aluminum (Al) and silver (Ag), and the gold may be partially replaced by at least one element selected from the group consisting of palladium (Pd), iridium (Ir) and platinum (Pt).

The light-transmissible electrode contains cobalt laminated as a first electrode layer with a film thickness of from 0.5 to 15 nm on the p-type contact layer, and gold laminated as a second electrode layer with a film thickness of from 3.5 to 25 nm on the cobalt layer. Then, the two layers are alloyed by heating process. After the heating process, the element distribution in a direction of the depth from the surface of the p-type contact layer is formed such that Au permeates the p-type contact layer more deeply than Co.

The heating process is preferably performed in a gas containing oxygen. At least one member or a mixture gas of members selected from the group consisting of $O_2$, $O_3$, CO, $CO_2$, NO, $N_2O$, $NO_2$ and $H_2O$ may be used as the oxygen-containing gas. Alternatively, a mixture gas of an inert gas and at least one member selected from the group consisting of $O_2$, $O_3$, CO, $CO_2$, NO, $N_2O$, $NO_2$ and $H_2O$ may be used as the oxygen-containing gas. Alternatively, a mixture gas of an inert gas with a mixture gas of members selected from the group consisting of $O_2$, $O_3$, CO, $CO_2$, NO, $N_2O$, $NO_2$ and $H_2O$ may be used as the oxygen-containing gas. That is, the oxygen-containing gas means a gas containing oxygen atoms or a molecular gas containing oxygen atoms.

Any atmospheric pressure may be used in the heating process so long as the atmospheric pressure is not lower than the pressure in which the gallium nitride compound semiconductor is not thermally decomposed at the temperature used in the heating process. When only an $O_2$ gas is used as the oxygen-containing gas, the oxygen-containing gas may be introduced under the pressure not lower than the pressure of decomposition of the gallium nitride compound semiconductor. When a mixture gas of $O_2$ and another inert gas is used as the oxygen-containing gas, the oxygen-containing gas may be introduced under the total pressure of the mixture gas set to be not lower than the pressure of decomposition of the gallium nitride compound semiconductor and under the partial pressure of the $O_2$ gas having a ratio not lower than about $10^{-6}$ to the total pressure of the mixture gas. In short, heating may be performed sufficiently if a very small amount of oxygen-containing gas is provided. Incidentally, the upper limit of the amount of the oxygen-containing gas to be introduced is not particularly limited on the basis of the alloy characteristic (contact resistance) between the p-type layer and the electrode. That is, any amount of the oxygen-containing gas can be used so long as production can be made.

The temperature used in the heating process is most preferably in a range of from 500 to 600° C. A low-resistance p-type gallium nitride compound semiconductor with an entirely saturated resistivity can be obtained at a temperature not lower than 500° C. On the other hand, the electrode can be alloyed well at a temperature not higher than 600° C. The preferred temperature range is from 450 to 650° C.

The present invention is applied also to the case where the electrode formed on the p-type semiconductor is not light-transmissible. When the electric resistance of the p-type semiconductor is reduced so that the electrode is formed spotwise on the p-type semiconductor, the whole p-n junction surface serves as a light-emitting region in the same manner as the background-art GaAs, or the like. This is because, also in this case, a large amount of light is emitted from the side surface.

An embodiment of the present invention will be described below.

This embodiment shows a light-emitting diode. FIG. 1 shows the configuration of group III nitride compound semiconductor layers in the light-emitting diode.

| Layer | Composition | Dopant |
|---|---|---|
| p-type layer 15 | p-GaN | Mg |
| Layer 14 including a light-emitting layer | including InGaN layer | |
| n-type layer 13 | n-GaN | Si |
| Buffer layer 12 | AlN | |
| Substrate 11 | Sapphire (surface a) | |

The n-type layer 13 may be of a double-layered structure having an n⁻ layer of low electron density on the layer 14 side and an n⁺ layer of high electron density on the buffer layer 12 side. The latter is called n-type contact layer.

The layer 14 including a light-emitting layer is not limited to the superlattice structure. A single hetero type structure, a double hetero type structure, a homo junction type structure, or the like, may be used as the structure of the light-emitting device. The layer 14 entirely or partially serves as a role of a light-emitting layer.

A group III nitride compound semiconductor layer doped with an acceptor such as magnesium and having a wide band gap may be interposed between the layer 14 and the p-type layer 15. This interposition is carried out for preventing electrons imparted into the layer 14 from diffusing into the p-type layer 15.

The p-type layer 15 may be of a double-layered structure having a p⁻ layer of low hole density on the layer 14 side and a p⁺ layer of high hole density on the electrode side. The latter is called p-type contact layer.

In the light-emitting diode configured as described above, each of the group III nitride compound semiconductor layers is formed by execution of MOCVD on a general condition.

Figure 3:
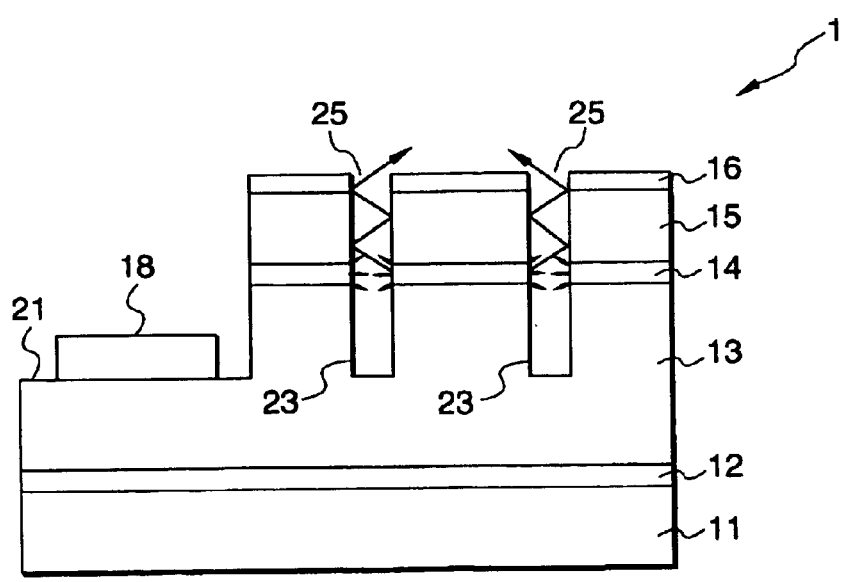
FIG. 3 is a sectional view taken along the line III—III in FIG. 2.

Then, a mask is formed and the p-type layer 15, the layer 14 and the n-type layer 13 are partially removed by reactive ion etching to thereby reveal an n-type seat electrode-forming surface 21 on which an n-type seat electrode 18 will be formed (see FIG. 3). Simultaneously with the formation of the n-type seat electrode-forming surface, the groove 23 is formed.

A Co (cobalt) layer (1.5 nm) and an Au (gold) layer (6 nm) are successively laminated onto the whole surface of a wafer by an evaporation apparatus. Then, a photo resist is applied on the laminate evenly and then the portions of the photo resist corresponding to the n-type seat electrode-forming surface 21 and the groove 23 are removed by photolithography. A part of the light-transmissible electrode-forming material corresponding to the above portions is removed by etching to thereby expose the semiconductor layer. Then, the photo resist is removed. Thus, a light-transmissible electrode 16 is formed. Alternatively, the groove 23 may be formed after the formation of the light-transmissible electrode 16.

The circumferential edge portions of the n-type seat electrode-forming surface 21 and the groove 23 may be coated with an electrically-insulating and light-transmissible protective film (made of silicon oxide, silicon nitride, titanium oxide, aluminum oxide, or the like). A sputtering method or a CVD method can be used as the method for forming the protective film.

Then, a V (vanadium) layer (17.5 nm), an Au layer (1.5 μm) and an Al (aluminum) layer (10 nm) are successively evaporated and laminated by a lift-off method to thereby form a p-type seat electrode 19.

An n-type seat electrode 18 made of V and Al is also formed by a lift-off method.

The wafer obtained as described above is put into a heating furnace. The inside of the furnace is evacuated to be not higher than 1 Pa. Then, $O_2$ is supplied to the furnace to ten and several Pa. In this condition, the temperature of the furnace is set to 550° C. and heating is performed for about 4 minutes. Thus, the light-transmissible electrode 16 and the p-type seat electrode 19 are alloyed, the n-type seat electrode 18 of V and Al is alloyed and these alloys form ohmic junctions with the p-type and n-type semiconductors.

Then, the wafer is cut into chips by an ordinary method.

In the light-emitting device 1 according to the embodiment configured as described above, light is emitted into the groove 23 from the portion of the layer 14 revealed on the side surface of the groove 23, as shown in FIG. 3. The light is reflected in the groove 23 and goes out from the opening portion 25 of the groove to the light emission observation surface side.

Further, in the light-emitting device 1 according to this embodiment, three current diffusion paths 161, 162 and 163 are formed by the groove 23. The groove 23 is designed so that the respective current diffusion paths are equal to one another in terms of the distance of each path from an end portion (first end portion) connected to the p-type seat electrode 19 to an end portion (second end portion) facing the n-type seat electrode 18 and in terms of the width of each path. Hence, the respective electrical resistance values of the current diffusion paths are equal to one another so that a current is evenly distributed from the p-type seat electrode 19 into the current diffusion paths. Hence, the density values of the currents injected from the current diffusion paths into the p-type semiconductor layer are equalized. Hence, uniform light emission is achieved on the light emission observation surface. Incidentally, the electrical resistance values of the current diffusion paths 161, 162 and 163 partitioned by the groove 23 are high compared with that of the planar light-transmissible electrode (in the background art) with no groove. Accordingly, the currents are more evenly injected into the p-type semiconductor layer.

Figure 4:
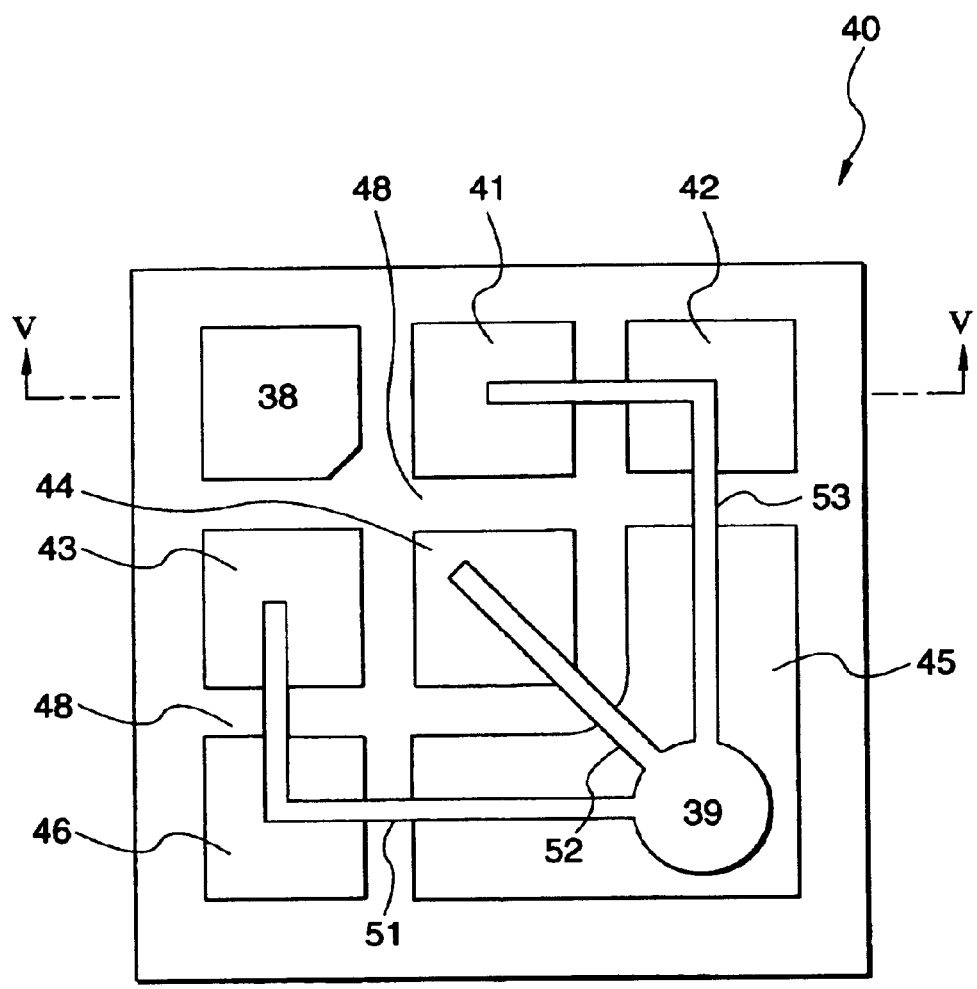
FIG. 4 is a plan view of a light-emitting device according to another embodiment of the present invention.
Figure 5:
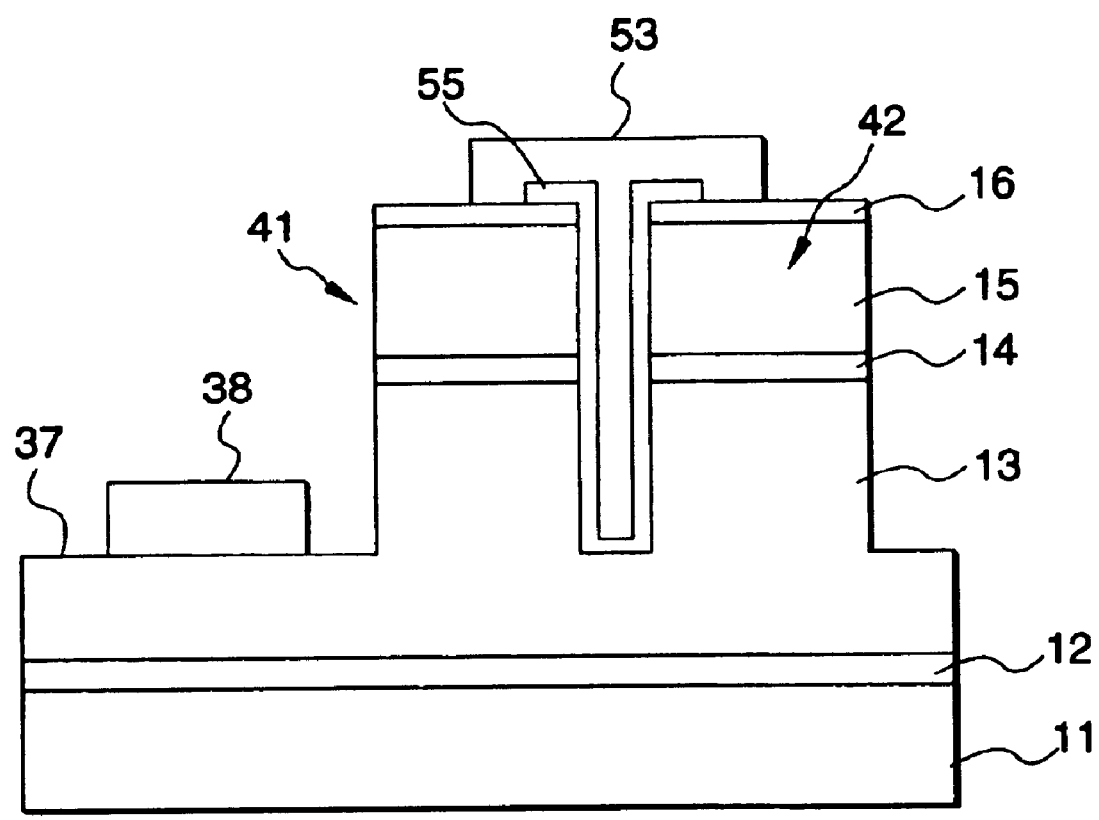
FIG. 5 is a sectional view taken along the line V—V in FIG. 4.

FIGS. 4 and 5 show a light-emitting device 40 according to another embodiment of the present invention. Incidentally, constituent parts the same as those in the previous embodiment are referenced correspondingly and the description of these constituent parts will be therefore omitted. In this embodiment, there are provided a plurality of semiconductor layer blocks 41 to 46 so that the layer 14 is revealed on the respective side surfaces of the blocks 41 to 46. In other words, it can be said that the semiconductor laminate portion is partitioned into the blocks 41 to 46 by a lattice-like groove 48. The groove 48 has a depth so as to reach at least the layer 14. The groove 48 can be formed by etching in the same manner as that in the previous embodiment. Hence, the groove has a depth at a level equal to a surface 37 on which an n-type seat electrode 38 is formed. Because the respective blocks are separated from one another, auxiliary electrodes 51, 52 and 53 are provided so as to extend from a p-type seat electrode 39. Hence, a current from the p-type seat electrode 39 is supplied to the light-transmissible electrode 16 in each block. Incidentally, an electrically insulating layer 55 is formed between each of the auxiliary electrodes 51, 52 and 53 and the semiconductor laminate layer.

The light-emitting device 40 is formed in the same manner as the light-emitting device 1 is formed in the previous embodiment. Incidentally, after the electrically insulating layer 55 is laminated, the p-type seat electrode 39 and the auxiliary electrodes 51, 52 and 53 are formed by vapor deposition. The p-type seat electrode 39 and the auxiliary electrodes 51, 52 and 53 are made of one material so as to be integrated with one another. The materials used in the respective constituent parts in the embodiment may be the same as those of the respective constituent parts in the previous embodiment.

According to the light-emitting device 40 formed as described above, light emitted from the side surface of each of the blocks 41 to 46 goes out to the light emission observation surface side through the groove 48.

The present invention is not limited to the embodiments and the description thereof at all. Various changes which can be easily conceived by those skilled in the art may be contained in the present invention without departing from the description of the scope of claim.

What is claimed is:

1. A group III nitride compound semiconductor light-emitting device comprising:

a semiconductor laminate portion including a light-emitting layer; and a groove formed in said semiconductor laminate portion so as to extend from a light emission observation surface of said semiconductor laminate portion to reach at least said light-emitting layer; and a p-type electrode and an n-type electrode formed in a same surface side of said semiconductor laminate portion, wherein said semiconductor laminate portion is partitioned into a plurality of blocks by said groove, wherein an auxiliary electrode is provided so as to extend from said p-type electrode such that a current from said p-type electrode is supplied to each of said plurality of blocks, and wherein an electrically insulating layer is formed between said auxiliary electrode and said semiconductor laminate portion.

2. A group III nitride compound semiconductor light-emitting device according to claim 1, wherein said groove is distributed substantially equally in said light emission observation surface.

3. A group III nitride compound semiconductor light-emitting device according to claim 1, wherein said groove is formed by etching.

4. A group III nitride compound semiconductor light-emitting device according to claim 3, wherein an n-type seat electrode-forming surface is provided at a level equal to a bottom of said groove.

5. A group III nitride compound semiconductor light-emitting device according to claim 1, wherein said groove includes an opening portion formed in said light emission observation surface, and wherein said groove reveals a side surface of said light-emitting layer.

6. A group III nitride compound semiconductor light-emitting device according to claim 5, wherein said groove includes a circumferential wall; and wherein light emitted from the revealed portion of said side surface of said light-emitting layer into said groove is reflected by a portion of said circumferential wall of said groove out of the opening portion of said groove toward an outside of said groove.

7. A group III nitride compound semiconductor light-emitting device according to claim 1, wherein a width of said groove is in a range of from 0.5 to 30 µm, and preferably said width of said groove is in a range of from 1 to 25 µm, and more preferably, said width of said groove is in a range of from 1.5 to 20 µm, and more preferably, said width of said groove is in a range of from 2 to 15 µm.

8. A group III nitride compound semiconductor light-emitting device according to claim 1, wherein said groove comprises a V-shaped groove.

9. A group III nitride compound semiconductor light-emitting device according to claim 1, wherein a width of said groove is distributed substantially unequally in said light emission observation surface.

10. A group III nitride compound semiconductor light-emitting device according to claim 1, wherein each of said plurality of blocks include a light-emitting region revealed on a side surface thereof.

11. A group III nitride compound semiconductor light-emitting device according to claim 1, wherein said semiconductor laminate portion includes a plurality of current diffusion paths formed between said p-type seat electrode and said n-type seat electrode, wherein each of said plurality of current diffusion paths are divided by said groove, and wherein each of said plurality of current diffusion paths includes a substantially same length and a substantially same width.

12. A group III nitride compound semiconductor light-emitting device according to claim 1, further comprising:

an n-type seat electrode-forming surface formed in said semiconductor laminate portion and adapted to mount said n-type seat electrode, wherein a bottom surface of said groove is located substantially at a same height as said n-type seat electrode-forming surface.

13. A group III nitride compound semiconductor light-emitting device comprising:
a semiconductor laminate portion including a light-emitting layer;
a groove formed in said semiconductor laminate portion; and
a p-type electrode and an n-type electrode formed in a same surface side of said semiconductor laminate portion,
wherein said groove extends from an opening in a light emission observation surface of said semiconductor laminate portion into said semiconductor laminate portion to reach at least said light-emitting layer,
wherein said groove reveals a side surface of said light-emitting layer,
wherein said semiconductor laminate portion is partitioned into a plurality of blocks by said groove,
wherein an auxiliary electrode is provided so as to extend from said p-type electrode such that a current from said p-type electrode is supplied to each of said plurality of blocks, and
wherein an electrically insulating layer is formed between said auxiliary electrode and said semiconductor laminate portion.

14. A group III nitride compound semiconductor light-emitting device according to claim 13, wherein said groove includes a circumferential wall; and
wherein light emitted from the revealed portion of said side surface of said light-emitting layer into said groove is reflected by a portion of said circumferential wall of said groove out of the opening portion of said groove toward an outside of said groove.

* * * * *